United States Patent
Koyama et al.

(10) Patent No.: US 8,896,389 B2
(45) Date of Patent: Nov. 25, 2014

(54) OSCILLATION CIRCUIT HAVING NEGATIVE RESISTANCE ELEMENT AND OSCILLATOR USING THE OSCILLATION CIRCUIT

(75) Inventors: Yasushi Koyama, Kamakura (JP); Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/384,758

(22) PCT Filed: Aug. 13, 2010

(86) PCT No.: PCT/JP2010/064037
§ 371 (c)(1),
(2), (4) Date: Jan. 18, 2012

(87) PCT Pub. No.: WO2011/027672
PCT Pub. Date: Mar. 10, 2011

(65) Prior Publication Data
US 2012/0119838 A1     May 17, 2012

(30) Foreign Application Priority Data
Sep. 7, 2009   (JP) ................................. 2009-205671

(51) Int. Cl.
*H03L 1/00* (2006.01)
*H03B 7/08* (2006.01)

(52) U.S. Cl.
CPC ....................................... *H03B 7/08* (2013.01)
USPC .. 331/175; 331/167; 331/117 R; 331/117 FE; 331/96; 331/107 T; 331/115

(58) Field of Classification Search
USPC .......... 331/158, 116 R, 116 FE, 117 FE, 167, 331/175, 117 R, 96, 115
See application file for complete search history.

(56) References Cited

U.S. PATENT DOCUMENTS

| | | | |
|---|---|---|---|
| 3,081,436 A | 3/1963 | Watters | 331/107 |
| 3,237,123 A | 2/1966 | Watters | 331/107 |
| 5,539,761 A | 7/1996 | Golub et al. | |
| 7,386,024 B2 | 6/2008 | Sekiguchi et al. | 372/45.012 |
| 7,463,104 B2 | 12/2008 | Sekiguchi et al. | 331/107 |

(Continued)

FOREIGN PATENT DOCUMENTS

| | | |
|---|---|---|
| CN | 101447763 A | 6/2009 |
| DE | 1186519 | 2/1965 |
| JP | 2007-124250 | 5/2007 |
| JP | 2007124250 A | 5/2007 |

OTHER PUBLICATIONS

Reddy et al., "Bias Stabilization for Resonant Tunnel Diode Oscillators", 8099a IEEE Microwave and Guided Wave Letters, vol. 5, No. 7, Jul. 1995; pp. 219-221.

(Continued)

*Primary Examiner* — Arnold Kinkead
(74) *Attorney, Agent, or Firm* — Fitzpatrick, Cella, Harper & Scinto

(57) ABSTRACT

The present disclosure relates to an oscillation circuit including a differential negative resistance element, a resonance circuit connected to the differential negative resistance element, and a stabilization circuit connected in parallel with the negative resistance element to suppress parasitic oscillation. The stabilization circuit includes a variable shunt resistor and an adjusting device for adjusting the shunt resistor.

14 Claims, 5 Drawing Sheets

(56) References Cited

U.S. PATENT DOCUMENTS

| | | | |
|---|---|---|---|
| 7,589,596 B2* | 9/2009 | Masuda et al. | 331/36 C |
| 7,684,455 B2 | 3/2010 | Ouchi et al. | 372/45.011 |
| 7,709,797 B2 | 5/2010 | Sekiguchi et al. | 250/339.01 |
| 7,719,374 B2* | 5/2010 | Kuosmanen | 331/175 |
| 7,869,036 B2 | 1/2011 | Kajiki et al. | 356/328 |
| 7,889,015 B2 | 2/2011 | Sekiguchi et al. | 331/107 |
| 7,924,107 B2 | 4/2011 | Koyama et al. | |
| 7,933,305 B2 | 4/2011 | Ouchi et al. | 372/99 |
| 2011/0089516 A1 | 4/2011 | Sekiguchi | 257/443 |
| 2011/0248724 A1 | 10/2011 | Sekiguchi | 324/633 |

OTHER PUBLICATIONS

Wang et al., "A Design Procedure for Tunnel Diode Microwave Oscillators", IEEE, ICMMT2008 Proceedings, 2008.

S. Hoshi, et al., "Double-Recessed 0.1-μm-Gate InP HEMTs for 40Gbit/s Optical Communication Systems", Jpn. J. Appl. Phys. vol. 42, 2003, pp. 2367-2370.

M. Asada, et al., "Resonant Tunneling Diodes for Sub-Terahertz and Terahertz Oscillators", Jpn. J. Appl. Phys., vol. 47, No. 6, pp. 4375-4384, 2008.

International Preliminary Report on Patentability dated Mar. 22, 2012 in International Application No. PCT/JP2010/064037.

U.S. Appl. No. 13/384,222, filed Jan. 13, 2012, by Ryota Sekiguchi et al.

U.S. Appl. No. 13/384,223, filed Jan. 13, 2012, by Toshihiko Ouchi et al.

Reddy, M., et al., "Bias Stabilization for Resonant Tunnel Diode Oscillators", 8099a IEEE Microwave and Guided Wave Letters, vol. 5, No. 7, Jul. 1995, pp. 219-221.

Chinese Office Action dated Jun. 3, 2014 for counterpart Chinese Patent Appln No. 201080039654.5.

* cited by examiner

OSCILLATION CIRCUIT HAVING NEGATIVE RESISTANCE ELEMENT AND OSCILLATOR USING THE OSCILLATION CIRCUIT

TECHNICAL FIELD

The present invention relates to an oscillation circuit having a negative resistance element used to generate electromagnetic waves and to an oscillator using the oscillation circuit. More particularly, the invention relates to an oscillation circuit using a negative resistance element, such as a resonant tunneling diode, to generate electromagnetic waves containing a frequency component in a terahertz-band frequency domain (frequencies of 30 GHz or higher but not higher than 30 THz) in at least part of the waves, and an oscillator using the oscillation circuit.

BACKGROUND ART

As a solid-state device which operates and oscillates in a frequency band of terahertz waves, an oscillator using a negative resistance element, such as a resonant tunneling diode (RTD), has been proposed. In particular, an oscillator using an RTD takes advantage of an electromagnetic wave gain based on the intersubband transition of electrons in the semiconductor quantum well structure of the RTD, and room-temperature oscillation in a terahertz band has been reported. Japanese Patent Application Laid-Open No. 2007-124250 and Jpn. J. Appl. Phys., Vol. 47, No. 6, pp. 4375-4384, 2008 disclose an oscillator in which a double-barrier RTD and a planar slot antenna are integrated on a semiconductor substrate. The oscillator oscillates at room temperature in a terahertz band under a bias voltage at which differential negative resistance appears in the current-voltage characteristics of the RTD.

An oscillator using a negative resistance element, such as an RTD, is known to cause low-frequency parasitic oscillation attributable to a bias circuit including a power supply. Parasitic oscillation can be a cause for degradation in the oscillation output of a desired resonance frequency in a frequency band of terahertz waves. To take measures against this problem, IEEE MICROWAVE AND GUIDED WAVELETTERS, VOL. 5, NO. 7, JULY 1995 pp. 219-221 discloses a technique for locating a stabilization circuit between a bias power supply and an RTD. The stabilization circuit is comprised of a resistor and a capacitor disposed in parallel with the RTD, and sets a resonance circuit to low impedance in all frequencies except a resonance frequency. In addition, the stabilization circuit is located in a position within a distance of $\lambda/4$ ($\lambda$ is the wavelength of a desired resonance frequency in a terahertz-band frequency domain) from the RTD. With these contrivances, parasitic oscillation is suppressed to realize room-temperature oscillation in a terahertz band with an oscillator using a negative resistance element.

CITATION LIST

Patent Literature

PTL 1: Japanese Patent Application Laid-Open No. 2007-124250

Non Patent Literature

NPL 1: Jpn. J. Appl. Phys., Vol. 47, No. 6, pp. 4375-4384, 2008
NPL 2: IEEE MICROWAVE AND GUIDED WAVELETTERS, VOL. 5, NO. 7, JULY 1995 pp. 219-221
NPL 3: Jpn. J. Appl. Phys., Vol. 42, 2367 (2003)

SUMMARY OF INVENTION

In order to apply these oscillators to communication or imaging in a terahertz band, the modulation operation of oscillation output is necessary. Methods of output modulation include direct modulation in which a bias applied to a negative resistance element is switched as in a conventional semiconductor laser, and external modulation in which a mechanical chopper or an optical component is externally provided. Of these methods, direct modulation is promising from the viewpoint of downsizing and speeding up an apparatus. On the other hand, an oscillator using a negative resistance element is known to vary in oscillation frequency due to bias voltage variation. In the oscillator using an RTD disclosed in Non Patent Literature 1, a bias variation of approximately 0.05 V causes the oscillation frequency to vary by 7% or so, thus causing the oscillation output to also vary. Accordingly, the oscillator using a negative resistance element has the possibility that the oscillation characteristics thereof, such as an oscillation frequency, may not stabilize during direct modulation based on bias switching.

An oscillation circuit as one aspect of the present invention includes: a negative resistance element; a resonance circuit connected to the negative resistance element; and a stabilization circuit connected in parallel with the negative resistance element to suppress parasitic oscillation; wherein the stabilization circuit includes a variable shunt resistor and a adjusting device for adjusting the shunt resistor.

In the oscillation circuit of the present invention, the variable shunt resistor and the adjusting device for adjusting the shunt resistor are provided in the stabilization circuit for suppressing mainly low-frequency parasitic oscillation. By adjusting the shunt resistor, a change is made typically to impedance in the low-frequency band (DC to several GHz) of the oscillation circuit including the negative resistance element. In response to this change, the oscillation frequency band of the oscillation circuit is switch between a desired frequency band (typically a terahertz band) and a low-frequency band (DC to several GHz or so, which is referred to as parasitic oscillation). That is, the oscillation circuit of the present invention is adapted so that the switching of oscillating operation and the adjustment of oscillation output can be performed with a bias voltage kept applied, by adjusting parasitic oscillation by varying the shunt resistor through the use of the adjusting device. In this way, modulating operation based on switching or output adjustment is enabled while retaining the bias voltage, by using the oscillation circuit of the present invention. Accordingly, an oscillation circuit capable of output modulation also in a terahertz band, while stabilizing oscillation characteristics, such as a frequency, and an oscillator using the oscillation circuit are realized.

Further features of the present invention will become apparent from the following description of exemplary embodiments with reference to the attached drawings.

DESCRIPTION OF EMBODIMENTS

Preferred embodiments of the present invention will now be described in detail in accordance with the accompanying drawings.

The important point in the oscillation circuit of the present embodiment is that the variable shunt resistor is provided in the stabilization circuit for suppressing parasitic oscillation to enable the output modulation of the oscillator, while stabilizing oscillation characteristics, such as a frequency.

Figure 1A:
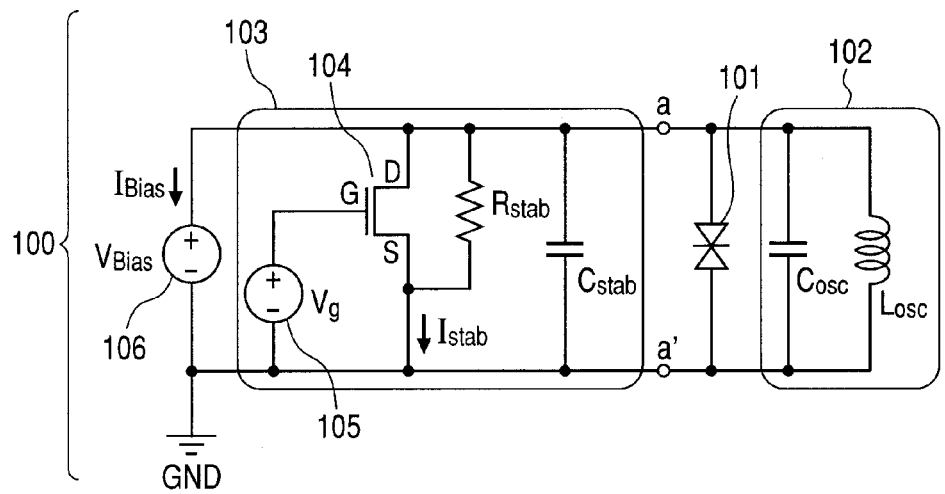
FIG. 1A is a drawing used to describe a configuration of an oscillation circuit according to an embodiment.
Figure 1B:
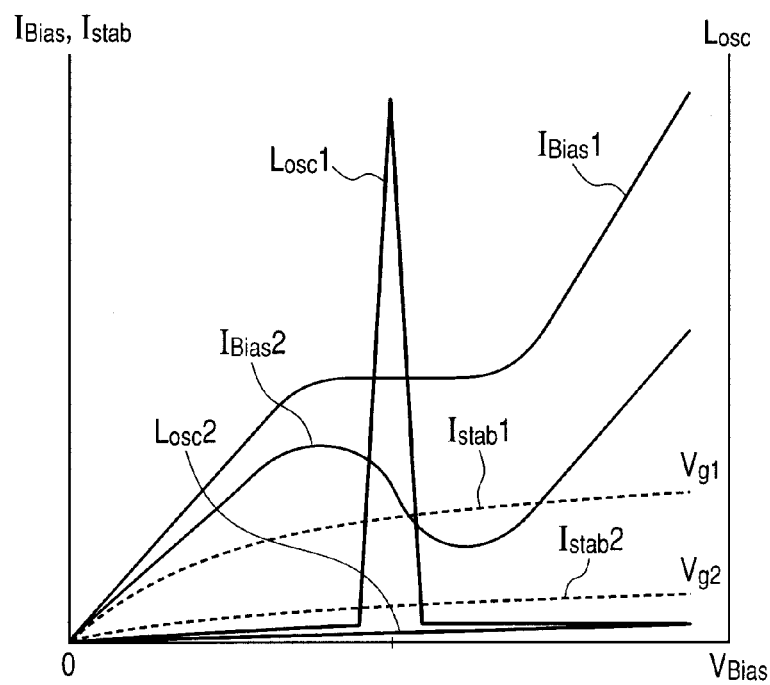
FIG. 1B is a drawing used to describe the operation of an oscillation circuit according to an embodiment.

Hereinafter, an oscillation circuit according to an embodiment of the present invention will be described using FIGS. 1A and 1B. FIG. 1A is used to describe the oscillation circuit of the present embodiment and FIG. 1B is used to describe the operation of the oscillation circuit of the present embodiment. In the present embodiment, a resonant tunneling diode is used as a negative resistance element. An oscillation circuit 100 of the present embodiment is comprised of a resonant tunneling diode (RTD) 101, a resonance circuit 102, and a stabilization circuit 103 including a FET 104 and an adjusting device 105. The RTD 101 is a high-frequency gain part and exhibits differential negative resistance in current-voltage characteristics illustrated in FIG. 1B ($I_{Bias}2$). The resonance circuit 102 serves as a resonator for determining the resonance frequency of the oscillation circuit 100. The oscillation circuit 100 oscillates at a frequency determined from a relationship between the differential negative resistance that the RTD 101 has and a resonance frequency determined by the structure of the resonance circuit 102. Here, in the present embodiment, the frequency typically belongs to a terahertz-band frequency domain. A power supply 106 is connected in parallel with the RTD 101, the resonance circuit 102, and the stabilization circuit 103, in order to apply a bias to the oscillation circuit 100.

The stabilization circuit 103 suppresses low-frequency parasitic oscillation in the oscillation circuit 100 and includes at least a capacitor $C_{stab}$ connected in parallel with the RTD 101 and a resistor $R_{stab}$ which is a shunt resistor. The stabilization circuit 103 can be located in a position within a distance of $\lambda/4$ ($\lambda$ is the wavelength of an oscillation frequency in the frequency domain of a terahertz band) from the RTD, so that the RTD 101 does not resonate with an external circuit including the power supply 106. In addition, the stabilization circuit 103 can have a structure smaller in size than the wavelength of low-frequency parasitic oscillation, so that the RTD 101 and the stabilization circuit 103 do not resonate with each other. Furthermore, the stabilization circuit 103 can be located in such a position as not to cause loss to a standing wave within the resonance circuit 102. For example, the stabilization circuit 103 may be located at a nodal point of the standing wave.

As a shunt resistor of the stabilization circuit 103, a FET 104 connected in parallel with the RTD 101 is provided in the oscillation circuit 100 of the present embodiment, in addition to the $R_{stab}$. In addition, the oscillation circuit 100 is provided with an adjusting device 105 for adjusting the resistance of the FET 104. In the present embodiment, a field-effect transistor (FET) which is a three-terminal device is used as an example of a variable resistor. For example, the drain electrode of the FET 104 is connected to the positive-polarity side of the RTD 101 and the source electrode of the FET 104 is grounded. The gate electrode of the FET 104 is connected to the adjusting device 105, so that an appropriate gate voltage $V_g$ is applied from the adjusting device 105. The source-drain resistance of the FET 104 can be varied by adjusting the gate voltage $V_g$.

The oscillation circuit 100 oscillates at a high frequency (typically in a terahertz band) when both of the following expressions 1 and 2 are simultaneously satisfied.

Amplitude Condition:

$$Re[Y_{RTD}] + Re[Y_{OSC}] \leq 0 \quad \text{Expression 1}$$

Phase Condition:

$$Im[Y_{RTD}] + Im[Y_{OSC}] = 0 \quad \text{Expression 2}$$

In addition, parasitic oscillation in a low-frequency domain is suppressed when the following expression 3 is satisfied. The reason for this is that the RTD 101 goes into parasitic oscillation in a low-frequency band (DC to several GHz) when resonating with an external circuit on the power supply 106 side from a terminal aa'.

Parasitic Oscillation Suppression Condition:

$$Re[Y_{RTD}] + Re[Y_a] > 0 \quad \text{Expression 3}$$

where, $Y_{RTD}$ is the admittance of the RTD 101, $Y_{OSC}$ is the admittance of the resonance circuit 102, and $Y_a$ is the admittance of a circuit (circuit including the stabilization circuit 103, the power supply 106, and external circuits) on the power supply 106 side from the terminal aa'. In addition, $Re[Y_{RTD}]$, $Re[Y_a]$ and $Re[Y_{OSC}]$ are the real parts of the admittances $Y_{RTD}$, $Y_a$ and $Y_{OSC}$, and $Im[Y_{RTD}]$ and $Im[Y_{OSC}]$ are the imaginary parts of the admittances $Y_{RTD}$ and $Y_{OSC}$.

As described above, in order to suppress parasitic oscillation, the oscillation circuit 100 needs to satisfy expression 3. In order to meet this requirement, the oscillation circuit 100 may be set to low impedance by the stabilization circuit 103 in all frequencies except a desired oscillation frequency $\omega_{OSC}$. For a low-frequency domain from DC to several GHz, among these frequencies, the oscillation circuit 100 is set to low impedance mainly by the shunt resistor which is a resistor connected in parallel with the RTD 10. For frequency domains higher than that frequency domain (from several GHz to the oscillation frequency $\omega_{OSC}$), the oscillation circuit 100 is set to low impedance mainly by a parallel capacitor $C_{stab}$. According to the abovementioned Non Patent Literature 2, the shunt resistance is desired to have a value equal to or somewhat smaller than the absolute value of the differential negative resistance of the RTD 101. In the present embodiment, the fixed-resistance parallel resistor $R_{stab}$ and the FET 104 serving as a variable-resistance parallel resistor function as the shunt resistor.

The oscillation circuit 100 allows the above-described shunt resistance to be adjusted to an arbitrary value by varying the gate voltage $V_g$ of the FET 104 by the adjusting device 105, thereby adjusting source-drain resistance. For example, if $V_g$ is set to $V_{g1}$ so that the combined resistance of the FET 104 and $R_{stab}$ is substantially the same as the absolute value of the differential negative resistance of the RTD 101, then the current-voltage characteristics of the shunt resistor and the oscillation circuit 100 are respectively represented as $I_{stab}1$ and $I_{Bias}1$ in FIG. 1B. At this time, since the condition given by the abovementioned expression 3 is satisfied in a frequency band from DC to several GHz, low-frequency parasitic oscillation is suppressed. Consequently, the oscillation circuit 100 oscillates at a high terahertz-band frequency determined by the RTD 101 and the resonance circuit 102 ($L_{OSC}1$ in FIG. 1B).

On the other hand, if the $V_g$ of the FET 104 is set to $V_{g2}$, so that the combined resistance of the FET 104 and the $R_{stab}$ is greater than the absolute value of the differential negative resistance, then the current-voltage characteristics of the shunt resistor and the oscillation circuit 100 are respectively represented as $I_{stab}2$ and $I_{Bias}2$ in FIG. 1B. At this time, since the parasitic oscillation suppression condition (abovementioned expression 3) is no longer satisfied, the oscillation circuit 100 oscillates at a low frequency of, for example, several GHz. At high terahertz-band frequencies, the oscillation output of the oscillation circuit 100 weakens ($L_{OSC}2$ in FIG. 1B). In this way, the oscillation circuit 100 enables oscillation switching and oscillation output adjustment with the bias voltage ($V_{Bias}$) kept applied, by adjusting the value of the shunt resistance with the adjusting device 105 and the FET 104. In addition, output modulation can be performed on the oscillation circuit 100 by adjusting the shunt resistance.

As described above, the output adjustment and switching of the oscillation circuit 100 are made feasible by adjusting the variable-resistance shunt resistor arranged in the stabilization circuit 103 and, thereby, adjusting the low-frequency impedance of the oscillation circuit 100. Thus, the conventional outstanding problem of the instability of oscillation characteristics, such as an oscillation frequency, during the output modulation of an RTD oscillation circuit is solved by taking advantage of this mechanism.

In addition, the configuration of the present embodiment enables a modulating unit, such as a transistor, to be integrated on a small scale in the vicinity of the RTD. Consequently, any delay due to an external circuit, such as a power supply, is avoided, compared with bias-based direct modulation, and therefore, even more high-speed modulating operation is expected. Furthermore, since modulation can be performed using the adjusting device 105 rather than a bias, the freedom degree of control is improved, compared with conventional direct modulation. Still furthermore, since there is no need for bias switching at the time of modulation, the risk that devices break down due to a surge current or the like attributable to transient phenomena is reduced.

Figure 2A:
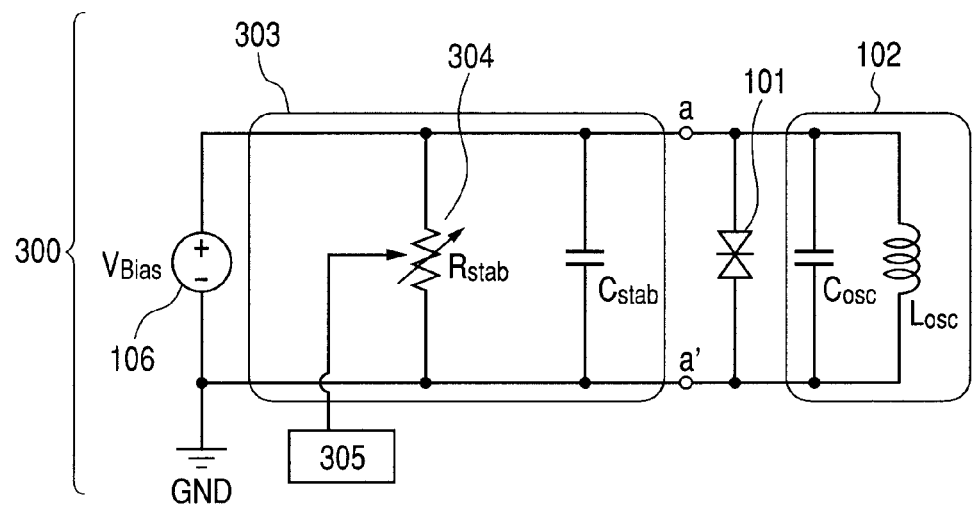
FIG. 2A is a drawing used to describe the configuration of modification 1 of an embodiment.

Note that in the present embodiment described heretofore, one of an Esaki diode, a Gunn diode, an IMPATT diode and a TUNNETT diode may be used as the negative resistance element. In addition, as the variable-resistance shunt resistor, a material, such as one of a photoresistor, a thermistor, a magnetoresistor and a strain resistor whose resistance changes with light, heat, magnetism or strain, respectively, may be used, in addition to the transistor mentioned in the present embodiment. In this case, an oscillation circuit 300 is configured as illustrated in FIG. 2A. A photoresistor element 304 may be adjusted, for example, by a light-irradiating unit 305 or a strain-resistance element 304 may be adjusted by a strain-applying unit 305. In either case, the variable resistor can have a structure smaller in size than the wavelength of parasitic oscillation. In addition, as in the oscillation circuit 400 illustrated in FIG. 2B, the switching and adjustment of oscillation output may be performed by adjusting a switch 404 with an adjusting device 405 and, thereby, switching the shunt resistor. At this time, the adjusting device 405 is selected so as not to interfere with the RTD 101 and the resonance circuit 102. The switch 404 can have a structure smaller in size than the wavelength of parasitic oscillation.

Figure 5:
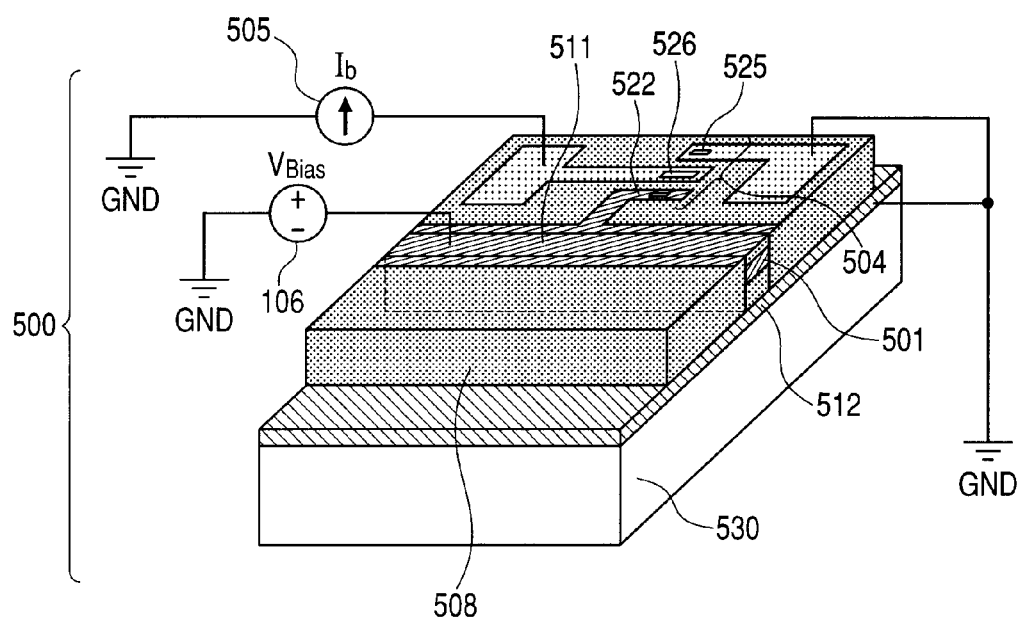
FIG. 5 is an external view of a modification of an example.

In addition, a cavity waveguide, a microstrip resonator, a patch antenna resonator, a slot antenna resonator, or the like may be used as the resonance circuit 102. Consequently, high frequencies can be efficiently taken out from the oscillation circuit 100 as electromagnetic waves. If a later-described plasmon waveguide illustrated in FIG. 5 is used as the resonance circuit, an oscillation circuit having even higher output is realized.

Hereinafter, even more specific examples of the present embodiment will be described in detail.

EXAMPLES

Figure 3A:
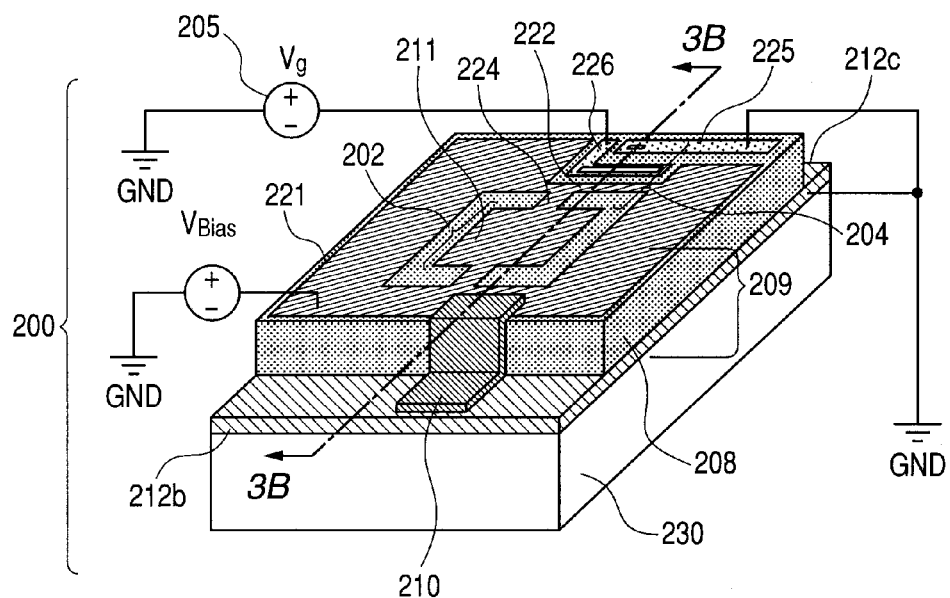
FIG. 3A is an external view used to describe a configuration of an oscillator according to an example.
Figure 3B:
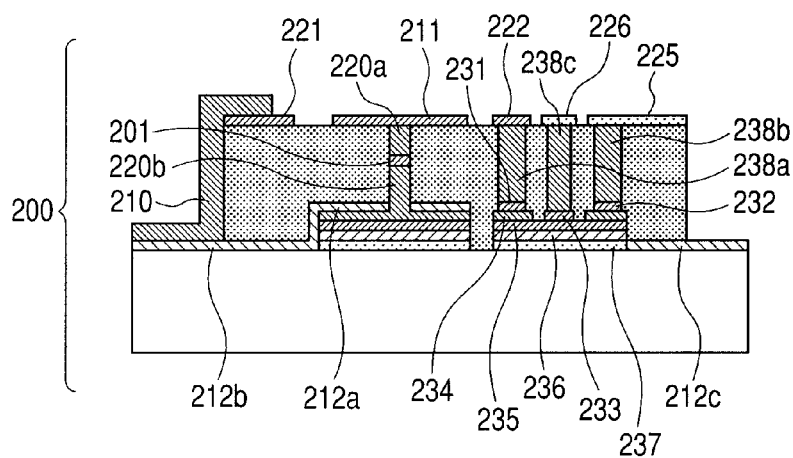
FIG. 3B is a cross-sectional view used to describe the configuration of the oscillator according to the example.
Figure 4A:
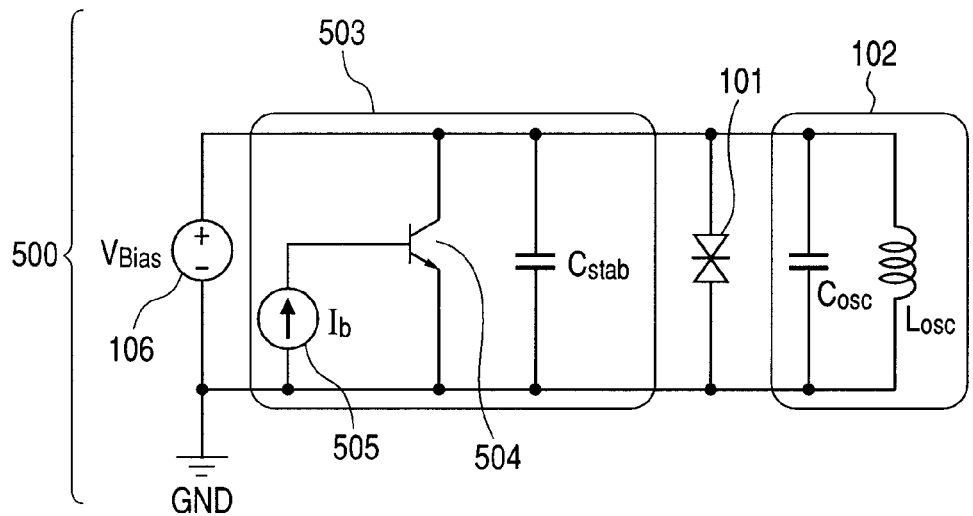
FIG. 4A is a drawing used to describe the configuration of modification 1 of the example.
Figure 4B:
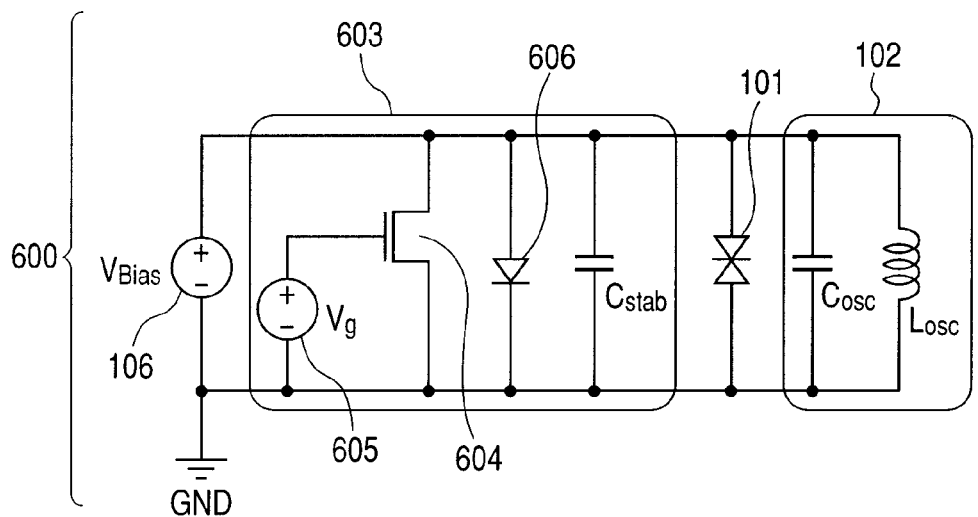
FIG. 4B is a drawing used to describe the configuration of modification 2 of the example.

Now, an oscillation circuit according to the present embodiment will be described using FIGS. 3A to 5. FIG. 3A is an external view of the present embodiment and FIG. 3B is a cross-sectional view thereof. FIGS. 4A, 4B and 5 are drawings used to describe modifications of the present embodiment.

An oscillation circuit 200 of the present embodiment is formed on a substrate 230, and is comprised mainly of an RTD 201, a patch antenna 202, a FET 204, an adjusting device 205, an MIM (Metal-Insulator-Metal) structure 209, and a resistive element 210. The RTD 201 uses a triple-barrier quantum well structure including the following constituent elements:

| First barrier layer | AlAs | 1.3 nm |
| First quantum well layer | InGaAs | 7.6 nm |
| Second barrier layer | InAlAs | 2.6 nm |
| Second quantum well layer | InGaAs | 5.6 nm |
| Third barrier layer | AlAs | 1.3 nm |

Here, the first quantum well layer, the second barrier layer and the second quantum well layer are layers of InGaAs/InAlAs lattice-matched to InP having a plane orientation (100). The first barrier layer and the third barrier layer are layers of AlAs not lattice-matched to InP. These layers are thinner than a critical film and are high-energy barriers. A resonant tunneling diode is formed by sandwiching a triple-barrier quantum well structure from above and below thereof with a spacer layer made of undoped InGaAs and an electrical contact layer made of n+InGaAs. In addition, contact layers 220a and 220b made of heavily-doped n++InGaAs are disposed on the top and bottom of the RTD 201.

The RTD 201 has a mesa structure, approximately 2 μmφ in diameter, and is formed by an ICP-RIE (Inductive Coupled Plasma-Reactive Ion Etching) method using a chlorine-based gas. The RTD 201 is sandwiched from the top and bottom thereof by a first electrode 211 connected to the contact layer 220a and a GND electrode 212a connected to the contact layer 220b. In the RTD 201 used in the present embodiment, a current density $J_p$=280 kA/cm$^2$, a peak-volley ratio of approximately 3, and a differential negative resistance of approximately −22Ω are obtained as current-voltage characteristics.

The patch antenna 202 having a structure, in which a dielectric material is sandwiched by two metal layers, corresponds to the resonance circuit 102 in the circuit diagram of FIG. 1A. An oscillation frequency is determined by the type and thickness of a dielectric material, the side length of the patch antenna 202, and the size and position of the RTD 201. The patch antenna 202 has a structure in which a dielectric layer 208 is sandwiched between the first electrode 211 and the GND electrode 212a. An electromagnetic wave resides within the dielectric material between the first electrode 211 and the GND electrode 212a. The first electrode 211 is a 150 μm×150 μm square λ/2 patch and has an oscillation frequency of approximately 0.5 THz. The RTD 201 is designed, so as to cause the patch antenna 202 and the RTD 201 to match in impedance with each other, when located in a position approximately 40 μm away from the center of the first electrode 211 in an A'A direction. A λ/4 microstrip line 224 is connected to the λ/2 patch, and the patch is connected to the second electrode 221 of the MIM structure 209 and the third electrode 222 of the FET 204. The microstrip line is located in a position where a standing wave of the resonant electromagnetic field of the patch antenna 202 has a node.

The first electrode 211 is a metal layer formed by a liftoff method and is made of Ti/Pd/Au (20 nm/20 nm/200 nm). The first electrode 211 is known as a low-resistance ohmic electrode for heavily-doped n++InGaAs. In the present embodiment, the first electrode 211, the second electrode 221 and the third electrode 222 are integrally formed using a Ti/Pd/Au (20 nm/20 nm/200 nm) layer. For the dielectric layer 208, BCB (benzocyclobutene) known as a low-loss material for high-frequency electromagnetic waves is used. The dielectric layer 208 is approximately 3 μm in thickness, and is formed by using a spin coating method and a dry etching method. The dielectric layer 208 also has the function to isolate the first electrode 211 and the GND electrode layer 212a from each other in a direct-current manner. For the GND electrode layer 212a, a metal layer formed by a liftoff method and made of Ti/Pd/Au/Ti (20 nm/20 nm/200 nm/20 nm) is used. The GND electrode layers 212a, 212b and 212c are grounded.

A stabilization circuit 103 is comprised of an MIM structure 209 which is a parallel capacitor $C_{stab}$, a shunt resistor including a FET 204 serving as a variable resistor and a parallel resistive element 210 which is a fixed resistor, and a power supply 205 serving as a adjusting device 105. For the parallel capacitor $C_{stab}$, the MIM structure 209 in which the dielectric layer 208 is sandwiched by the second electrode 221 and the GND electrode 212b is used. In the present embodiment, the parallel capacitor $C_{stab}$ is designed to have a capacitance of several pF, so as to short-circuit in a high-frequency domain from several GHz up to an oscillation frequency $\omega_{OSC}$.

The parallel resistive element 210 is connected between the second electrode 221 and the GND electrode layer 212b, and serves as part of the shunt resistor for setting a path between the electrodes to low impedance at low frequencies. Bismuth which is a semimetal is used for the parallel resistive element 210. Specifically, a 200 μm×80 μm×1 μm-thick bismuth film is formed by a liftoff method, so as to have a resistance of approximately 50Ω. For the FET 204, an InP-based HEMT (High Electron Mobility Transistor) is used, in order to integrate the FET 204 with an InP-based RTD. Epitaxial growth is performed on the same InP substrate in the order of the HEMT and the RTD, thereby forming a HEMT structure by removing part of a multilayer film including the RTD by wet etching. For example, the structure disclosed in Non Patent Literature 3 is utilized. The major constituent elements of the HEMT structure are an InAlAs carrier-supplying layer 235, an InGaAs channel layer 236, an InGaAs/InAlAs cap layer 234, and an InAlAs buffer layer 237. The HEMT structure has a gate length of 0.1 μm. The gate width of the HEMT structure was set to 300 μm, in order to obtain a desired resistance value. Ti/Pt/Au, which has ohmic contact with InAlAs and schottky contact with n+InGaAs, is used for a drain electrode 231, a source electrode 232 and a gate electrode 233. The drain electrode 231, the source electrode 232 and the gate electrode 233 are led out, by way of through-holes 238a, 238b and 238c respectively formed of Au, onto the upper surface of a dielectric layer, so as to connect to a third electrode 222, a fourth electrode 225, and a fifth electrode 226. The third electrode 222 is connected through the microstrip line 224 to the patch antenna 202, thus substantially coinciding with the second electrode 221 of the MIM structure 209. In addition, the fourth electrode 225 is connected to the GND electrode 212c and is grounded. The fifth electrode 226 is connected to the power supply 205 serving as the adjusting device 105.

The RTD 201 has a differential negative resistance of approximately −22Ω under the condition that $V_{bias}$=0.7 V. The HEMT of the present embodiment has a source-drain differential resistance of approximately 30Ω under the condition that $V_g$=0.3 V. Thus, the combined resistance of a shunt resistor comprised of the $R_{stab}$ and the FET 204 is approximately 20Ω. Since the oscillation circuit 200 is short-circuited at low frequencies, and therefore, parasitic oscillation is suppressed, the oscillation circuit oscillates in a terahertz band of 0.4 THz. On the other hand, the source-drain differential resistance is approximately 500Ω under the condition that $V_g$=−0.3 V. Thus, the combined resistance of the shunt resistor comprised of the $R_{stab}$ and the FET 204 is approximately 45Ω. Consequently, the oscillation circuit 200 is not fully short-circuited at low frequencies, and therefore, parasitic oscillation takes place. As a result, oscillation output in a terahertz band weakens.

As described above, the oscillation circuit 200 of the present embodiment enables the switching and adjustment of the oscillation output of the oscillation circuit by adjusting the source-drain resistance of the FET 204 placed in the stabilization circuit through the use of the adjusting device. According to the present embodiment, the conventional outstanding problem of the instability of oscillation characteristics, such as a frequency, during the output modulation of an RTD oscillation circuit is solved. As a modification of the present embodiment, a configuration is available in which, as illustrated in FIG. 4A, an HBT 504 is used as the variable resistor of a stabilization circuit 503 including a current source 505, and a plasmon waveguide is used as the structure of a resonance circuit. The plasmon waveguide is a resonant structure in which, as illustrated in FIG. 5, an RTD 501 and a dielectric layer 508 are sandwiched by two electrodes 511 and 512. This structure is suitable in raising the output power of the oscillation circuit 500 of the present embodiment. Alternatively, a plurality of RTDs 501 may be periodically disposed within the resonant structure. In such a structure, a layer including the RTDs 501 and a layer including the HBT 504 are transferred to a substrate 530 by means of metal junction. Here, an electrode 522, an electrode 525, and an electrode 526 (connected to the current source 505) are electrodes respectively led out from the collector electrode, the emitter electrode, and the base electrode (not illustrated) of the HBT 504. The HBT 504 is emitter-grounded.

Figure 2B:
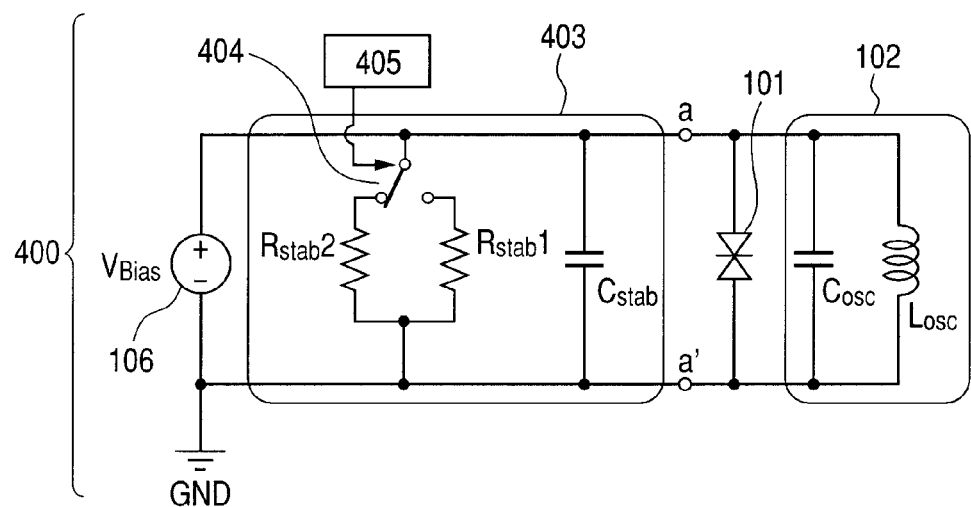
FIG. 2B is a drawing used to describe the configuration of modification 2 of an embodiment.

Such a configuration as described above realizes the oscillation circuit 500 having high output and easy to adjust and switch the output thereof. In addition, as another modification of the present embodiment, a configuration may be applied in which, as illustrated in FIG. 4B, a FET 604 (the base of which is connected to a voltage source 605) serving as a variable resistor and a schottky barrier diode 606 which is a nonlinear element are disposed in parallel as a shunt resistor. In this case, an oscillation circuit 600 even lower in power consumption is realized. As the variable resistor, one of an HFET, a MOSFET, a JFET and an IGBT is available, for example, as far as three-terminal devices are concerned. In addition, as a resistance change material, one of a variable resistor using a material utilizing nonvolatile recording capabilities, such as a TMR (tunnel magnetoresistor), a perovskite material whose resistance change is caused by electrical pulses, and a material having strain resistance effect whose resistance changes with strain, may be used. Any variable resistor may be used as long as the resistance thereof can be adjusted by inputting an electrical signal, light or heat to a resistive element. As illustrated in FIG. 2A, the resistance is adjusted by an input signal from the adjusting device. If the oscillation circuit is provided with a plurality of shunt resistors and a switch, as illustrated in FIG. 2B, one of a MEMS switch utilizing an actuator which operates on electrostatic attraction and a switching circuit using a FET and a diode in combination is available.

In the present embodiment, a triple-barrier resonant tunneling diode made of InGaAs/InAlAs and InGaAs/AlAs grown on an InP substrate has been described as the RTD 201. However, the present embodiment is not limited to these structures and material systems. Even for other combinations of structures and materials, the semiconductor element of the present embodiment can also be provided. For example, one of a resonant tunneling diode having a double-barrier quantum well structure and a resonant tunneling diode having a multiple-barrier quantum well including four or more barriers may be used. In addition, as a material system, a combination of materials selected from the group consisting of GaAs/AlGaAs, GaAs/AlAs or InGaAs/GaAs/AlAs formed on a GaAs substrate, InGaAs/AlGaAsSb formed on an InP substrate, InAs/AlAsSb or InAs/AlSb formed on an InAs substrate, and SiGe/SiGe formed on an Si substrate may be used. The structure and material may be selected from the group consisting of these structures and materials as appropriate, according to a desired frequency and the like. Note that in the present embodiment, a discussion has been made assuming that the carrier is electron. The present embodiment is not limited to this case, however, but an oscillation circuit using electron holes may also be applied. In this case, however, the polarity of circuit elements needs to be changed over. In addition, a material for the substrates 230 and 530 may be selected according to the purpose of use. Accordingly, a semiconductor substrate, such as one of a silicon substrate, a gallium arsenide substrate, an indium arsenide substrate, a gallium phosphide substrate and a gallium nitride substrate, may be used. Alternatively, one of a glass substrate, a ceramic substrate and a resin substrate may also be used. The above-described structures can be formed by using existing semiconductor processes.

Industrial Applicability

The present invention relates to an oscillation circuit having a negative resistance element used to generate electromagnetic wave (terahertz waves, in particular). This oscillation circuit can be used as, for example, a light source section of tomography (laminagraphy) apparatus, spectroscopical inspection apparatus or radio communication equipment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-205671, filed Sep. 7, 2009, which is hereby incorporated by reference herein in its entirety.

The invention claimed is:

1. An oscillation circuit comprising;
   a differential negative resistance element;
   a resonance circuit connected in parallel with the differential negative resistance element in a place between a terminal a and a terminal a';
   a bias power supply connected in parallel with the differential negative resistance element in a place between the terminal a and the terminal a' in order to apply a bias to the differential negative resistance element; and
   a stabilization circuit connected in parallel with the differential negative resistance element in a place between the terminal a and the terminal a' to suppress parasitic oscillation,
   wherein the stabilization circuit includes a variable shunt resistor connected in parallel with the differential negative resistance element in a place between the terminal a and the terminal a' and an adjusting device for adjusting the shunt resistor.

2. The oscillation circuit according to claim 1, wherein one of adjustment and switching is performed on oscillation output by adjusting the shunt resistor through the use of the adjusting device.

3. The oscillation circuit according to claim 1, wherein the shunt resistor includes a transistor.

4. The oscillation circuit according to claim 1, wherein the stabilization circuit is connected to a position where a resonant standing wave of the resonance circuit has a node.

5. The oscillation circuit according to claim 1, wherein the differential negative resistance element is a resonant tunneling diode.

6. The oscillation circuit according to claim 1, wherein the variable shunt resistor includes a plurality of shunt resistors, and wherein the adjusting device adjusts variable shunt resistor by switching the plurality of shunt resistors.

7. An oscillator comprising:
   a substrate; and
   an oscillation circuit according to claim 1 integrated on the substrate.

8. A method for adjusting an oscillation circuit including a differential negative resistance element, the method comprising:
   performing one of adjustment and switching on the oscillation output of the oscillation circuit in a frequency band higher than the low-frequency band on the oscillation circuit by adjusting the impedance of the oscillation circuit in a low-frequency band by varying the shunt resistance of a stabilization circuit for suppressing parasitic oscillation;
   wherein a resonance circuit is connected in parallel with the differential negative resistance element in a place between a terminal a and a terminal a';
   wherein a bias power supply is connected in parallel with the differential negative resistance element in a place between the terminal a and the terminal a' in order to apply a bias to the differential negative resistance element;
   wherein the stabilization circuit is connected in parallel with the differential negative resistance element in a place between the terminal a and the terminal a' to suppress parasitic oscillation, and
   wherein the stabilization circuit includes a variable shunt resistor connected in parallel with the differential negative resistance element in a place between the terminal a and the terminal a' and an adjusting device for adjusting the shunt resistor,
   the method further comprising:
   performing one of adjustment and switching on the oscillation output of the oscillation circuit in a frequency band higher than the low-frequency band on the oscillation circuit by adjusting the impedance of the oscillation circuit in a low-frequency band by varying the shunt resistance by means of the adjusting device.

9. The oscillation circuit according to claim 1, further comprising a bias device for applying a bias to the differential negative resistance element, wherein the adjusting device for adjusting the shunt resistor is different from the bias device.

10. A method for adjusting an oscillation circuit according to claim 8, wherein oscillation output adjustment or oscillation switching is carried out while applying a bias to the differential negative resistance element.

11. An oscillation circuit comprising;
a resonant tunneling diode;
a resonance circuit connected in parallel with the resonant tunneling diode to suppress parasitic oscillation,
a stabilization circuit connected in parallel with the resonant tunneling diode to suppress parasitic oscillation, and
a bias power supply connected in parallel with the resonant tunneling diode in order to apply a bias to the resonant tunneling diode,
wherein the stabilization circuit includes a variable shunt resistor and an adjusting device for adjusting the shunt resistor.

12. An oscillator comprising:
a substrate; and
an oscillation circuit according to claim 11 integrated on the substrate.

13. A method for adjusting an oscillation circuit including a differential negative resistance element,
the method comprising performing one of adjustment and switching on the oscillation output of the oscillation circuit in a frequency band higher than the low-frequency band on the oscillation circuit by adjusting the impedance of the oscillation circuit in a low-frequency band by varying the shunt resistance of a stabilization circuit for suppressing parasitic oscillation,
wherein the differential negative resistance element is a resonant tunneling diode, and
wherein the oscillation circuit further comprises a bias power supply connected in parallel with the resonant tunneling diode in order to apply a bias to the resonant tunneling diode.

14. An oscillation circuit according to claim 1, wherein the stabilization circuit is disposed between the differential negative resistance element and the bias power supply.

* * * * *